United States Patent [19]

Tierney, Jr.

[11] Patent Number: 5,565,716
[45] Date of Patent: Oct. 15, 1996

[54] VARIABLE RESISTANCE, LIQUID-COOLED LOAD BANK

[75] Inventor: Dennis J. Tierney, Jr., North Kingstown, R.I.

[73] Assignee: The United States of America as represented by the Secretary of the Navy, Washington, D.C.

[21] Appl. No.: 396,950

[22] Filed: Mar. 1, 1995

[51] Int. Cl.⁶ .................................................. H02J 3/06
[52] U.S. Cl. .......................... 307/154; 307/149; 62/430; 62/434; 361/688; 361/689; 361/699
[58] Field of Search .................................. 307/154, 149; 62/430, 434; 361/688, 689, 699

[56] References Cited

U.S. PATENT DOCUMENTS

| | | | |
|---|---|---|---|
| 4,037,045 | 7/1977 | Beriger et al. | 174/15 |
| 4,445,047 | 4/1984 | Cannon | 307/31 |
| 4,475,152 | 10/1994 | Ikegame | 363/141 |
| 4,613,822 | 9/1986 | Reid | 324/426 |
| 4,879,629 | 11/1989 | Tustaniwskyj | 361/385 |
| 5,216,580 | 6/1993 | Davidson et al. | 361/185 |
| 5,424,588 | 6/1995 | Cantor et al. | 307/154 |

*Primary Examiner*—Jonathan Wysocki
*Assistant Examiner*—Albert W. Paladini
*Attorney, Agent, or Firm*—Michael J. McGowan; James M. Kasischke; Prithvi C. Lall

[57] ABSTRACT

A load bank is constructed using a plurality of tubes made from electrically conductive material and a fluid system that supplies cooling fluid to the tubes. Each of a plurality of electrically conductive clamps is selectively positioned to electrically connect at least two of the tubes in a spaced apart parallel relationship. Each clamp can be adjusted in terms of the amount of force applied to the tubes it connects so that positioning of each clamp is adjustable along the length of the connected tubes. A combination of the clamps and the tubes form an electrically resistive current-carrying circuit that serves as the load for a power source while the cooling fluid serves to dissipate the heat generated in the load.

18 Claims, 2 Drawing Sheets

5,565,716

VARIABLE RESISTANCE, LIQUID-COOLED LOAD BANK

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The present invention relates generally to load banks, and more particularly to a variable-resistance, DC-type liquid-cooled load bank.

(2) Description of the Prior Art

Load banks are essentially resistive networks used to dissipate the energy of electrical currents. Although air-cooled load bank systems offer the simplest designs for most applications, the hardware required to meet high power or variable electrical demands frequently makes the overall size of such systems cost prohibitive or size prohibitive. In contrast, liquid-cooled load banks offer enhanced cooling benefits with a typically more compact design. However, prior art liquid-cooled load banks are not designed to meet high power DC applications or variable electrical demands.

SUMMARY OF THE INVENTION

Accordingly, it is an object of the present invention to provide a liquid-cooled load bank capable of being adjusted to a variety of electrical demands.

Another object of the present invention is to provide a liquid-cooled load bank that uses a non-hazardous cooling fluid.

Yet another object of the present invention is to provide a liquid-cooled load bank that can be configured in a variety of ways to provide a compact design for a particular application.

Other objects and advantages of the present invention will become more obvious hereinafter in the specification and drawings.

In accordance with the present invention, a load bank is constructed using a plurality of tubes made from electrically conductive material. A fluid system supplies cooling fluid such as deionized water to the tubes. The fluid system also receives the cooling fluid after it has passed through the tubes so that the tubes and the fluid system form a closed loop. Each of a plurality of electrically conductive clamps is selectively positioned to electrically connect at least two of the tubes. The clamps also maintain spaced apart parallel relationships between the tubes. Each clamp can be adjusted in terms of the amount of force applied to the tubes it connects so that positioning of each clamp is adjustable along the length of the connected tubes. A combination of the clamps and the tubes form an electrically resistive current-carrying circuit that serves as the load for a power source while the cooling fluid serves to dissipate the heat generated in the load.

BRIEF DESCRIPTION OF THE DRAWING(S)

Other objects, features and advantages of the present invention will become apparent upon reference to the following description of the preferred embodiments and to the drawings, wherein.

DESCRIPTION OF THE PREFERRED EMBODIMENT(S)

Figure 1:
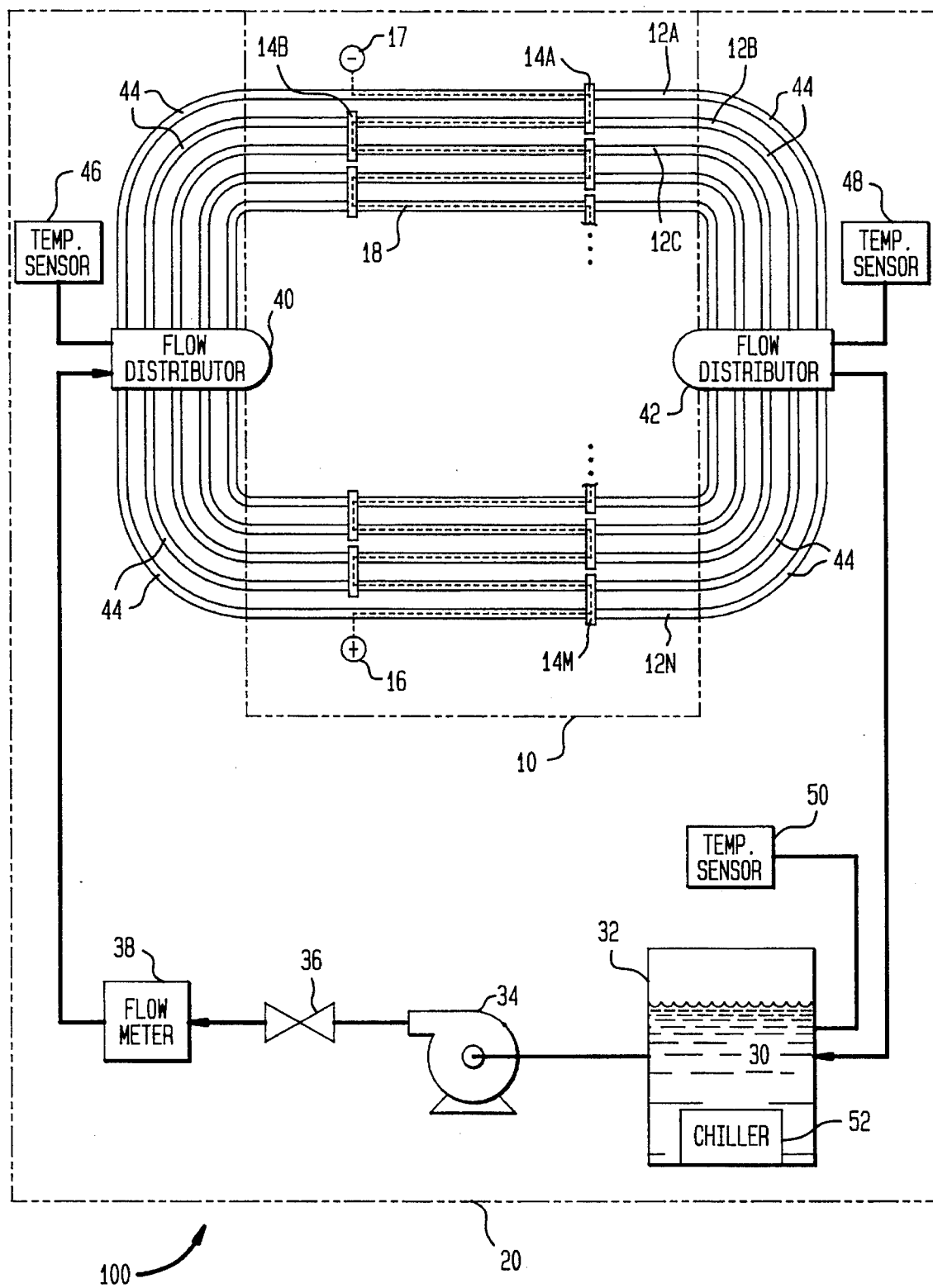
FIG. 1 is a schematic view of a liquid-cooled load bank according to a preferred embodiment of the present invention.

Referring now to the drawings, and more particularly to FIG. 1, a schematic view of a variable-resistance, liquid-cooled load bank in accordance with the present invention is shown and referenced generally by numeral 100. In general, load bank 100 includes current-carrying electric resistance network 10 and cooling fluid system 20.

Resistance network 10 is constructed from a plurality of electrically conductive tubes 12A, . . . , 12N cooperating with a plurality of electrically conductive couplers 14A, . . ., 14M. Tubes 12A, . . . , 12N are made from any electrically conductive material such as stainless steel or copper. In the preferred embodiment, American Iron and Steel Institute (AISI) type 304 stainless steel is selected because: 1) it has good electrical resistivity per unit length of tube, in that the design will be compact yet offer a sufficient amount of heat transfer surface area, 2) it is non-corrosive in an outdoor environment, and 3) it is readily available in industry. The following text contains further detail regarding the design of the preferred embodiment.

In the preferred embodiment, tubes 12A, . . . , 12N are selected to be straight tubes for simplifying construction and reducing costs. However, it is to be understood that the tubes could also be shaped. Tubes 12A, . . . , 12N are maintained in a spaced apart parallel configuration by means of couplers 14A, . . . , 14M which also serve to electrically couple tubes 12A, . . . , 12N to form resistance network 10. Thus, when a voltage is applied across terminals 16 and 17, electric current flows through the walls of tubes 12A, . . . , 12N and through couplers 14A, . . . , 14M in a path defined by dashed lines 18. Although path 18 is shown as a series-type current carrying path, the present invention is not so limited. Indeed as will be explained in greater detail below, the present invention facilitates movement of couplers 14A, . . . , 14M thereby allowing the current-carrying path defined by tubes 12A, . . . , 12N and couplers 14A, . . . , 14M to be configured for a specified resistance. Typically, tubes 12a, . . . , 12N and couplers 14a, . . . , 14M are made from the same material so that they will possess the same resistivity characteristics.

For high power applications, resistance network 10 must maintain a relatively fixed resistance as any small change in resistance greatly affects power levels. However, the resistivity of tubes 12A, . . . , 12N changes with temperature. Thus, cooling fluid system 20 is provided to pump cooling fluid through tubes 12A, . . . , 12N to remove the heat generated in resistance network 10 when a voltage is applied across terminals 16 and 17. The original temperature of cooling fluid 30 in reservoir 32 and the set cooling fluid flow rate through network 10 are both used to establish an overall load bank liquid temperature gradient that subsequently defines a nominal resistance of network 10. Thus, resistance of network 10 can be fine tuned by adjusting either of these set values. In this way, cooling fluid 30 can maintain the configured resistance of resistance network 10.

In the preferred embodiment, system 20 is coupled to resistance network 10 to form a closed-loop system forming load bank 100. Non-hazardous cooling fluid 30 is stored in reservoir 32. To supply cooling fluid 30 to tubes 12A, . . . , 12N in a controlled fashion, pump 34, valve 36, flowmeter 38 and flow distributors 40 and 42 (e.g., pipe headers, throttle valves, etc.) cooperate to control the flow rate of cooling fluid 30 passing through tubes 12A, . . . , 12N. Total flow rate is controlled by throttling pump 34 using valve 36. Typically, flow distributors 40 and 42 act as pipe headers that provide uniform flow to tubes 12A, . . . , 12N. Also, if desired, individual throttle valves (not shown) could be incorporated into individual ones of tubes 12A, . . . , 12N to alter the uniform flow distribution. To insure that each of tubes 12A, . . . , 12N is electrically isolated from any conductive component in system 20, non-conductive tubes (e.g., rubber tubes) 44 connect flow distributors 40 and 42 to tubes 12A, . . . , 12N. Thus, each tube 12A, . . . , 12N serves as an individual resistance element.

Flow distributors 40 and 42 control the flow path taken by cooling fluid 30. For example, flow distributors 40 and 42 can be valves that direct the fluid flow along a single path incorporating all of tubes 12A, . . . , 12N. However, it is important that cooling fluid 30 not lose its cooling features along the flow path. Accordingly, it may be necessary to have flow distributors cooperate with tubes 44 and tubes 12A, . . . , 12N in such a way that a number of shorter, independent fluid flow paths are defined.

Figure 2:
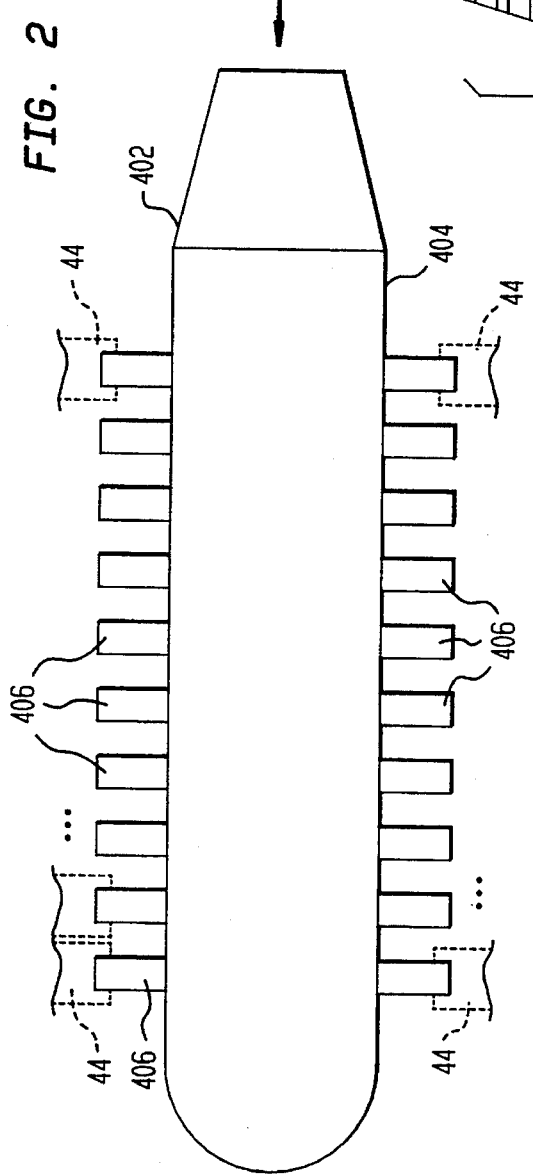
FIG. 2 is a schematic view of one type of flow distributor that can be used with the present invention.

An example of flow distributor 40 is shown schematically in FIG. 2. (Flow distributor 42 can be of similar design.) Flow distributor 40 includes flow reducer 402, header pipe 404 and a plurality of distribution pipes 406 that connect to tubes 44. Cooling fluid enters flow reducer 402, as indicated by arrow 200, where the flow rate is reduced. The total flow is slowed so that the flow from header pipe 404 to each (or selected ones) of distribution pipes 406 is a pressure-driven uniform flow. Selected ones of distribution pipes 406 can be blocked if a smaller power source is to be connected to load bank 100.

Referring now to FIG. 1, to monitor the temperature of cooling fluid 30, temperature sensors 46, 48 and 50 are positioned to provide the temperature of cooling fluid 30 throughout cooling fluid system 20. Good heat exchange efficiency is achieved with a 6–8 feet per second flow rate in tubes 12A, . . . , 12N while the cooling fluid temperature after a single-pass through a tube flow path should not exceed 30° C. Note that these two values can be used as a guide for initially setting up the desired configuration of network 10.

The average temperature of cooling fluid 30 in reservoir 32 will not vary much if the amount of cooling fluid 30 in reservoir 32 is large relative to the amount pumped through network 10 at any given time. However, if requirements dictate a smaller reservoir or if a larger than planned power source must be discharged, a built-in chiller heat exchanger 52 can be located in reservoir 32 to remove waste heat and maintain an approximate supply temperature.

In the preferred embodiment, deionized water is used as cooling fluid 30. Since it is free from contaminants, deionized water maximizes heat transfer while minimizing current leakage from tubes 12A, . . . , 12N into cooling fluid 30. deionized water is a poor electrical conductor in comparison with the electrically conductive tubing. Furthermore, deionized water is non-hazardous thereby minimizing environmental concerns in the event of a leak in load bank 100. The cooling fluid is not limited to deionized water, and other fluids having good heat transfer characteristics and high electrical resistivity can also be used.

Each of tubes 12A, . . . , 12N operates as an individual current-carrying resistive element within resistance network 10. The resistivity of each tube is dependent on its wall thickness, length and temperature. Tubes 12A, . . . , 12N are physically separated from one another and electrically connected by couplers 14A, . . . , 14M. Accordingly, knowledge of the resistivity per unit length of each tube 12A, . . . , 12N combined with selective placement of couplers 14A, . . . , 14M allows resistance network 10 to be customized for a particular application. For example, one could change the power levels absorbed by resistance network 10 by configuring resistance network 10 to define either a series resistance (FIG. 1), a parallel resistance or a combination series-parallel resistance current-carrying path.

To facilitate the configuration and predictability of resistance network 10, it is assumed herein that: 1) each of tubes 12A, . . . , 12N is identical in terms of wall-thickness and diameter, 2) each of couplers 14A, . . . , 14M is identical, and 3) each of couplers 14A, . . . , 14M is designed to identically space any two of tubes 12A, . . . , 12N sufficiently apart to prevent arcing between the coupled tubes. Thus, any two of couplers 14A, 14M can be used to maintain any two of tubes 12A, . . . , 12N parallel to one another. The resulting side-by-side arrangement of tubes can occur in a single tier or multiple tiers.

Figure 3:
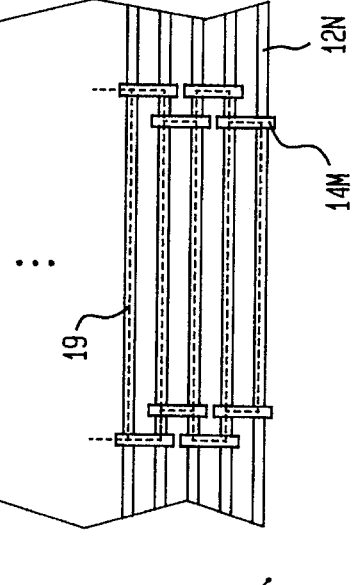
FIG. 3 is a side view of an electrically conductive coupler used in the preferred embodiment to connect two electrically conductive tubes.

One suitable coupler design is shown in the side view of FIG. 3 where coupler 14 is comprised of identical half sections 140 and 142 having respective semi-circular channels 140a, 140b and 142a, 142b. Channels 140a and 142a form sleeve 144 while channels 140b and 142b form sleeve 146 when half sections 140 and 142 are joined together. Bolt 148 passes through half section 140 and 142. Nut 150 cooperates with bolt 148 to draw half sections 140 and 142 together about each of two tubes (not shown in FIG. 3) which fit in sleeves 144 and 146, respectively. Thus, coupler 14 clamps onto the tubes passing through sleeves 144 and 146. Good electrical conductivity between each coupler and its clamped tubes can be insured by providing an electrically conductive lubricant on the surface of the tubes. This also makes it easier to slide the couplers to new positions on the tubes. One such conductive lubricant is Therm 201 manufactured by Omega.

As mentioned above, couplers 14A, . . . , 14M can be used with tubes 12A, . . . , 12N to define a series resistance current-carrying path as shown in FIG. 1. Couplers 14A, . . . , 14M can also be used with tubes 12A, . . . , 12N to define a parallel resistance current-carrying path as shown in the schematic view of FIG. 4. The parallel resistance current carrying path is defined by dashed lines 19. In addition, couplers 14A, . . . , 14M and tubes 12A, . . . , 12N could be configured to provide a combination of series and parallel resistance sections within resistance network 10.

The following detail is provided regarding construction of the preferred embodiment of the invention. Tube bank sizing and cooling fluid definition, in addition to system component identification, characterize the load bank design effort. The load bank construction is optimized by minimizing tubing diameter and wall thickness to provide a greater magnitude of current resistance and to create a more compact design. However, the tubing inner diameter should be maximized to slow cooling fluid velocity and to increase the internal surface area for enhanced heat transfer. The design must also prevent the cooling fluid from boiling or flashing.

Stainless steel is used for the load bank over other metals because it does not corrode in an outdoor environment and it offers good electrical resistivity properties. Typically, stainless steel or aluminum are the materials used for outdoor tubing applications. Stainless steel has an ambient resistivity of 72 micro-ohm-centimeters (μ-ohm-cm) while aluminum is only 10 m-ohm-cm. Both from a sizing and expense perspective, stainless steel was selected for the tube bank design.

The design and fabrication of the load bank was accomplished using standard material construction techniques. The tubing selected is AISI 304 stainless steel; a commonly used material in industry. To select a tubing size, certain variables and limitations must be considered. First, for environmental reasons, water is used as the cooling fluid medium; however, other coolants such as oils and water with an ethylene glycol additive can be used within the scope of the invention. Because fresh water contaminants reduce electrical resistance and enhance electrical leakage currents, deionized water is used. Tubing is selected from commercial available gage sizes. These sizes can be found in Edgecomb Inc., *Edgecomb Buyers Guide*, Slatersville, R.I. 1978 which, is incorporated herein by reference.

The developed embodiment uses a constant speed motor joined to a centrifugal pump to circulate the cooling fluid. One design uses a pump delivering 150 gpm with a head rise of 140 ft. A fiberglass 1000-gallon holding tank is used in this design to provide cooling fluid. The tank should withstand a maximum temperature of 130 degrees Fahrenheit (F) to prevent tank softening and the possible breakdown of tank resins. Temperature rise of the cooling fluid is limited.

These restrictions are used to determine the optimal tubing size. The total power to be dissipated in this design is $\dot{q}_{total}$=750 kW=2,559,075 BTU/hr. The pump design point flow is $\dot{Q}_{total}$=150 gpm=0.3342 ft³/s. The total energy added to the fluid can be expressed in terms of the bulk-temperature difference.

$$\dot{q}_{total} = \dot{m}_{total} C_p (T_{b2} - T_{b1}) \quad (1)$$

All properties of the deionized water are evaluated at the average bulk temperature, $T_{b2}$=130° F. The inlet temperature is assumed to be ambient $T_{b1}$=68° F. Therefore, the average bulk temperature is $$T_{baverage} = \frac{(T_{b1} + T_{b2})}{2} = 99° F. \quad (2)$$

Because all properties for the deionized water were evaluated at the average bulk temperature, $T_{baverage}$, the following assumptions are made. The heat capacity of the cooling fluid is $C_p$=1.0 BTU/1 bm° F. The density of the fluid is $\rho$=62 1 bm/ft³. The total mass flux is calculated assuming a constant density, $\dot{m}_{total} = \dot{Q}_{total}\rho$=20.7 1 bm/s.

The calculated bulk temperature rise of the water based on the total energy added and pump design point flow was $(T_{b2}-T_{b1})$=34.2° F. This bulk temperature rise occurs regardless of tube size selection.

The minimum number of tubes that are required for a specific tube size can be calculated. Tubing size for the load bank must be calculated because initially a load bank design that consists of #8 tubing seems the most desirable because it meets the minimal tube diameter and relative wall thickness thereby providing a greater magnitude of circuit resistance, hence fewer tubes. A design utilizing #20 tubing best meets the objective of maximizing tube diameter to slow cooling liquid velocity and enhance heat transfer. The ideal tubing size for this application is calculated to be somewhere in between these two sizes. The minimum number of tubes is represented as $n_t$.

For convenience, the heat transfer analysis between the tube wall and the fluid is presented on an individual tube basis. Since the preferred tubing arrangements all use parallel layouts, it is assumed that both the energy added and the fluid flow are divided equally among all of the tubes. Pipe headers are used to slow down and evenly distribute the fluid flow. As a result, it is assumed that total power (heat added) is dissipated equally among each tube: $\dot{q}_t=\dot{q}_{total}/n_t$.

The pipe headers allowed the total fluid flow to be equally divided among a number of tubes, or tube paths, depending on the layout of the design. Space considerations determine that it is impractical to place more than 24 tubes in a configuration for parallel fluid flow. Additional tubes must be installed on a separate tier, and the fluid must flow serially between tiers. Continuing with the individual tube heat transfer analysis, let the number of tube paths be denoted as $n_p$. Again, it is assumed that the total flow rate was divided equally in each tube, $\dot{Q}_t = \dot{Q}_{total}/n_p$.

The flow area of a single tube is shown as A. From the individual volume flux and the flow area of a single tube, tube velocity was is $v=\dot{Q}_t/A$. Using assumed constants for the fluid density, $\rho$; gravity, g; friction, $f$=0.025 (Moody chart). Given that a standard tube length, L=20 ft.

The pressure drop, $\Delta P$, is estimated through the load bank design from a simple form of the Bernoulli equation:

$$\Delta P = \left(\frac{\rho v^2}{2g}\right)\left(\frac{fL}{d}\right) \quad (3)$$

Because the heat transfer process is dependent on the Reynolds and Prandtl numbers, each needs to be known for the tube diameter and fluid medium. Using assumed constants for the kinematic viscosity and Prandtl number evaluated at the average bulk temperature $v$=7.54×10⁶ ft²/s and Pr=4.589. The Reynolds number was determined from $Re_d = vd/v$.

For fully developed turbulent flow in smooth tubes, a well known estimation is used to evaluate the Nusselt number.

$$Nu_d = 0.023 Re_d^{0.8} Pr^{0.4} \quad (4)$$

This estimation is given by Holman, J.P., *Heat Transfer*, McGraw-Hill Book Company, Inc., New York, N.Y., 1981, which is hereby incorporated by reference.

This equation can be used for fluids with Prandtl number ranging between 0.6 and 100 with moderate temperature differences between wall and fluid conditions. The equation usually represents data within ±25%. The equation is valid for fully developed flow which can be verified by approximating the entrance length, $L_e$, for the turbulent flow boundary layer using well known estimations such as that provided by White, F.M., *Fluid Mechanics*, McGraw-Hill Book Company, Inc., New York, N.Y., 1979, which is hereby incorporated by reference.

$$L_e/d = 4.4 Re_d^{1/6} \quad (5)$$

The nondimensionalized equation for the Nusselt number was used to determine the convection heat-transfer coefficient, h.

$$Nu_d = \frac{hd}{k} \quad (6)$$

Using a constant, k, for the fluid thermal conductivity evaluated at the average bulk temperature k=0.3636 BTU/(hr ft °F.). The surface area of a single 20-ft long tube as provided is $A_s$, and the wall temperature is $T_W$. The total heat transfer is expressed in terms of an average temperature difference between the tube wall and bulk temperature:

$$\dot{q}_i hA_s(T_W-T_b)_{average} \qquad (7)$$

This correlation was used to predict the temperature difference between the tube wall and cooling fluid at various locations along an individual tube. Ultimately the temperature difference and resulting wall temperature has an effect on tube resistivity which is dependent on temperature.

A rule of heat exchanger design, presented in Frass, A.P. and Ozisik, M.N., *Heat Exchanger Design*, John Wiley & Sons, Inc., New York, N.Y., 1965 which is hereby incorporated by reference, states that the wall temperature should be maintained at about 20° F. above the cooling fluid. The most influential parameters used in the selection process of a load bank tube design were flow velocity and resulting pressure drop. Since the principal barrier to heat transfer is the heat-transfer coefficient of the fluid, there is a strong incentive to increase the velocity through the tubes. For most applications, a good compromise between heat transfer and pumping power requirements is obtained with a fluid velocity of 6 to 8 ft/s. In order to maximize fluid velocity, #8 tubing offered the most compact design and the highest resistivity per unit length; however, the fluid velocity and necessary pumping power for a design consisting of #8 tubing does not correspond with suggested heat exchanger design rules. Furthermore, a design using #8 tubing inhibits the potential of the load bank to expand in order to accommodate larger power levels. Although #12 tubing more closely resembles heat exchanger design criteria, offering a fluid velocity and pump head of 9.0 ft/s and 10.0 pounds per square inch (psi) respectively, it also leaves little opportunity for possible future upgrade. Therefore, the preferred embodiment incorporates #16 or #20 gage tubing.

Based on the number of allowed tube paths in the allotted area (24), it is apparent that designs consisting of #12 and #16 tubing require a minimum of two tiers while a bank consisting of #20 tubing requires at least three. Tubing sizes greater than #16 offer a negligible advantage in performance for this application.

The preferred design consisted of two separate tiers of #16 tubing with 22 tubes per tier. The tube tiers were configured one above the other to maintain a compact design. The assembled tube bank was installed in a simple flow loop as illustrated in FIG. 1. The loop consisted of a 1000-gallon cooling liquid reservoir 32, constant-speed centrifugal pump 34, manual "gate-type" throttle valve 36, turbine flow meter 38, pipe headers 40 and 42 and the necessary plumbing and connections.

Figure 4:
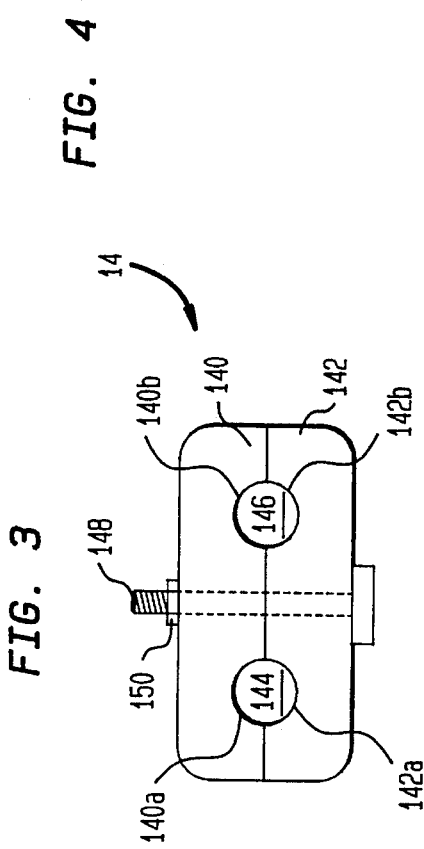
FIG. 4 is a schematic view of the tubes and couplers configured for a parallel resistance network.

Electrically, the evenly spaced load bank tubes were connected with 304 stainless steel clamps, fabricated specifically for this purpose. FIG. 3 and 4 display the connector and the connections between the tubes. The main connectors on both the positive and negative leads are large copper buss bars coupled with 2500 Ampere capacity cabling. Although the load bank is set up for a fixed resistance prior to use, the electrical resistivity of the pure metal changes with temperature.

In addition to insulating the load bank from the supports, deionized water is used to minimize the presence of leakage currents that may occur with fresh water contaminants. The connections between the headers and the load bank tubes are rubber as are the connections between the headers and the piping system. These measures provide electrical insulation and isolation to the load bank system.

The preceding design calculations assume that all of the load bank energy generated by resistance heating is delivered to the tube cooling fluid flow by natural convection. A secondary heat transfer method also exists: natural convection from the outside tube surfaces to the ambient air. This additional loss is rather small.

The load bank is designed to generate tube wall temperatures typically ranging from 120° F. to 130° F. Testing will occur throughout the year, so ambient air temperatures may vary from ≈10° F. to 90° F. Thus, the temperature difference between tube wall and air will range between 30° F. and 120° F. The resulting Grashof numbers based on the tube diameter $$Gr_d = \frac{g\beta\Delta T d^3}{v^2} \qquad (8)$$

will be in the laminar flow range of 60,000 to 280,000, and a typical free-convection heat transfer correlation predicts average Nusselt numbers to vary between 5.9 and 7.7, resulting in heat transfer coefficients in the range 1.0 to 1.4 Btu/(hr ft$^2$°F.). This represents less than 1% of the values calculated for internal water flow.

Although the present invention has been described relative to a specific embodiment, it is not so limited. For example, the electrically conductive tubes could be shaped although this may complicate the design of the coupler. In addition, each coupler could be designed to simultaneously clamp onto three or more tubes when a parallel resistance network is to be defined by the electrically conductive tubes and couplers. Thus, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A load bank comprising:

a plurality of tubes made from electrically conductive material;

a cooling fluid;

fluid supply means joined in fluid communication with said plurality of tubes for supplying said cooling fluid to said plurality of tubes; and electrical connection means electrically connecting said plurality of tubes to form an electrically resistive current-carrying circuit defined by said plurality of tubes and said electrical connection means.

2. A load bank as in claim 1 wherein said electrically conductive material is stainless steel and said cooling fluid is deionized water.

3. A load bank as in claim 2 wherein said stainless steel is AISI type 304 stainless steel.

4. A load bank as in claim 1 wherein at least a portion of each of said plurality of said tubes is straight.

5. A load bank as in claim 4 wherein said electrical connection means comprises electrically conductive clamps, each of said electrically conductive clamps being positionable on and electrically connecting at least two of said plurality of tubes.

6. A load bank as in claim 5 wherein said electrically conductive clamps maintain spaced apart relationships between said plurality of tubes.

7. A load bank as in claim 5 wherein said each of said electrically conductive clamps includes means for adjusting the amount of force applied to said at least two of said plurality of tubes, wherein positioning of each said electrically conductive clamp is adjustable along the length of said at least two of said plurality of tubes.

8. A load bank as in claim 5 further comprising an electrically conductive lubricant positioned between said each of said electrically conductive clamps and said at least two of said plurality of tubes for forming a conductive interface therebetween.

9. A load bank comprising:

a plurality of tubes made from electrically conductive material;

a cooling fluid;

a fluid system joined in fluid communication with said plurality of tubes for supplying said cooling fluid to said plurality of tubes and for receiving said cooling fluid after said cooling fluid has passed through said plurality of tubes, wherein said plurality of tubes and said fluid system form a closed loop; and a plurality of electrically conductive clamps, each one of said plurality of electrically conductive clamps selectively positioned in electrical communication on at least two of said plurality of tubes, said plurality of electrically conductive clamps for maintaining a spaced apart relationship between said plurality of tubes;

said each one of said plurality of electrically conductive clamps including means for adjusting the amount of force applied to said at least two of said plurality of tubes so that positioning of said each one of said plurality of electrically conductive clamps is adjustable along the length of said at least two of said plurality of tubes, wherein a combination of said plurality of electrically conductive clamps and said plurality of tubes form an electrically resistive current-carrying circuit.

10. A load bank as in claim 9 wherein said electrically conductive material is stainless steel and said cooling fluid is deionized water.

11. A load bank as in claim 10 wherein said stainless steel is AISI type 304 stainless steel.

12. A load bank as in claim 9 wherein said fluid system comprises:

a pump joined in fluid communication with said plurality of tubes;

a reservoir joined in fluid communication with said pump for holding said cooling fluid supplied to and received from said plurality of tubes;

a temperature control means positioned in contact with said cooling fluid for maintaining said cooling fluid at a preselected temperature; and a fluid velocity control means joined to said pump for controlling the velocity of said cooling fluid.

13. A load bank as in claim 9 further comprising an electrically conductive lubricant positioned between said each one of said plurality of electrically conductive clamps and said at least two of said plurality of tubes.

14. A load bank comprising:

a plurality of tubes made from electrically conductive material;

a plurality of electrically non-conductive tubes, each one of said plurality of electrically non-conductive tubes connecting two of said plurality of tubes, wherein a combination of said plurality of tubes and said plurality of electrically non-conductive tubes define at least one fluid carrying passage;

a cooling fluid;

a reservoir for holding said cooling fluid;

a pump joined in fluid communication between said reservoir means and said combination of tubes for controllably pumping said cooling fluid from said reservoir to said combination and for returning said cooling fluid after said cooling fluid has passed through said combination; and a plurality of electrically conductive clamps, each clamp being selectively positioned to electrically connect at least two of said plurality of tubes, said plurality of electrically conductive clamps maintaining spaced apart relationships between said plurality of tubes;

said each one of said plurality of electrically conductive clamps including means for adjusting the amount of force applied to said at least two of said plurality of tubes so that positioning of said each one of said plurality of electrically conductive clamps is adjustable along the length of said at least two of said plurality of straight tubes, wherein said plurality of electrically conductive clamps cooperating with said plurality of tubes form an electrically resistive current-carrying circuit.

15. A load bank as in claim 14 wherein said electrically conductive material is stainless steel and said cooling fluid is deionized water.

16. A load bank as in claim 15 wherein said stainless steel is AISI type 304 stainless steel.

17. A load bank as in claim 14 further comprising an electrically conductive lubricant positioned between said each one of said plurality of electrically conductive clamps and said at least two of said plurality of tubes.

18. A load bank as in claim 14 further comprising:

a temperature control means positioned in contact with said cooling fluid for maintaining said cooling fluid at a preselected temperature; and a fluid velocity control means joined to said pump for controlling the velocity of said cooling fluid.

* * * * *